United States Patent [19]

Ma et al.

[11] Patent Number: 5,860,921
[45] Date of Patent: Jan. 19, 1999

[54] METHOD FOR MEASURING THE REVERSIBLE CONTRIBUTION TO THE TRANSVERSE RELAXATION RATE IN MAGNETIC RESONANCE IMAGING

[75] Inventors: Jingfei Ma, Waukesha, Wis.; Felix Wehrli, Bala Cynwyd, Pa.

[73] Assignee: Trustees of the University of Pennyslvania, Philadelphia, Pa.

[21] Appl. No.: 843,011

[22] Filed: Apr. 11, 1997

[51] Int. Cl.[6] ................................................ A61B 5/055
[52] U.S. Cl. ......................... 600/410; 324/307; 324/309
[58] Field of Search ........................... 600/410; 324/307, 324/309, 318

[56] References Cited

U.S. PATENT DOCUMENTS

| 5,270,651 | 12/1993 | Wehrli | 324/308 |
| 5,321,357 | 6/1994 | Maryanski et al. | 324/300 |
| 5,410,250 | 4/1995 | Brown | 324/309 |

OTHER PUBLICATIONS

Ma, et al., "Fast 3D Large–Angle Sping–Echo Imaging (3D FLASE)," *Magnetic Resonance in Medicine*, vol. 35, 1996, pp. 903–910.

Ma, et al., "Method for Image–Based Measurement of the Reversible and Irreversible Contribution to the Transverse–Relaxation Rate," *Journal of Magnetic Resonance*, Series B, vol. 111, 1996, pp. 61–69.

Ma, et al., "Imperfection Immune Single–Scan Measurement of $T_2$ and $T_2$,," *Dept. of Readiology, University of Pennsylvania Medical Center*, one page, 1996.

Majumdar, et al., "In Vivo Relationship between Marrow $T2^*$ and Trabecular Bone Density Determined with a Chemical Shift–Selective Asymmetric Spin–Echo Sequence[1]," *JMRI*, vol. 2, 1992, pp. 209–219.

Ogawa, et al., "Intrinsic signal changes accompanying sensory stimulation: Functional brain mapping with magnetic resonance imaging," *Proc. Natl. Acad. Sci. USA*, vol. 89, Jul. 1992, pp. 5951–5955.

Ordidge, et al., "Assessment of Relative Brain Iron Concentrations Using $T_2$–Weighted and $T_2^*$–Weighted MRI at 3 Tesla," *Magnetic Resonance in Medicine*, vol. 32, 1994, pp. 335–341.

Ordidge, et al., "Simultaneous T2–and T2*–Weighted MRI Using a New Form of Stimulated Echo," *Proc. Soc. Magn. Reson., Third Annual Meeting Nice*, vol. 1, p. 670, 1995.

Pelc et al., "A Method for Mapping of $T_2$' and for Improved $T_2$ Measurements," *Proc. Magn. Reso. Med., Seventh Annual Meeting in San Francisco*, vol. 2, p. 746, 1988.

Villringer et al., "Dynamic Imaging with Lanthanide Cheates in Normal Brain: Contrast Due to Magnetic Susceptbility Effects," *Magnetic Resonance in Medicine*, vol. 6, 1988, pp. 164–174.

Wehrli, et al., "Trabecular Structure: Preliminary Application of M Interferometry[1]." *Radiology*, vol. 179, 1991, pp. 615–621.

Wismer, et al., "Susceptibility Induced MR Line Broadening: Applications to Brain Iron Mapping," *Journal of Computer Assisted Tomography*, vol. 12(2), Mar./Apr. 1988, pp. 259–265.

*Primary Examiner*—Marvin M. Lateef
*Assistant Examiner*—Eleni Mantis Mercader
*Attorney, Agent, or Firm*—Woodcock Washburn Kurtz Mackiewicz & Norris LLP

[57] ABSTRACT

A technique for accurately measuring two different spin configurations of transverse magnetization from which the reversible dephasing rate constant $R_2$' can be calculated. Such reversible dephasing may be caused by magnetic field inhomogeneity such as arising from intravascular changes in the oxidation state of hemoglobin, from brain iron, or from cancellous bone, which allows these characteristics to be measured. The different spin configurations can be measured in a single scan by deriving a small $R_2$' through independent and separate measurements of the two magnetization configurations generated by two RF pulses. The two configurations can be recalled independently of each other since they are affected differently by respective gradients flanking the β-pulse which permit one spin configuration to decay with $T_2$ while the other decays with $T_2^*$ from the same RF pulse. Since the spin configurations come from the same RF pulse, they have the same relaxation time, thus permitting small changes in $T_2$', and hence $R_2$', to be measured by setting the relaxation time of both configurations to be long.

27 Claims, 5 Drawing Sheets

METHOD FOR MEASURING THE REVERSIBLE CONTRIBUTION TO THE TRANSVERSE RELAXATION RATE IN MAGNETIC RESONANCE IMAGING

BACKGROUND OF THE INVENTION

1. Field of the Invention

The present invention relates generally to the field of magnetic resonance imaging (MRI) and MR spectroscopy, and more specifically, to a technique for accurately measuring $R_2'$, the rate constant for reversible dephasing of the transverse magnetization from magnetic field inhomogeneity such as that arising from intravascular changes in the oxidation state of hemoglobin, from brain iron, or from cancellous bone.

2. Description of the Prior Art

The effective nuclear magnetic resonance (NMR) transverse relaxation rate $R_2^*(\equiv 1/T_2^*)$ can usually be decomposed into two separate contributions: one arising from irreversible dephasing which occurs with rate constant $R_2(\equiv 1/T_2)$, and one due to reversible dephasing occurring with rate constant $R_2'$ ($\equiv 1/T_2'$). One way to measure $R_2'$ is to acquire two images with the same echo time, one of which is obtained with the gradient echo, the second with the spin echo. $R_2'$, by definition, can then be directly obtained from the pixel-to-pixel ratio of the two images. However, such an approach inevitably requires two separate scans. Another possible approach to measuring $R_2'$, which also requires two separate scans, is described by Wismer et al. in an article entitled "Susceptibility-Induced MR Line Broadening: Applications to Brain Iron Mapping," *J. Comput. Assist. Tomogr.*, Vol. 12, page 259 (1988), and by Majumdar et al. in an article entitled "In Vivo Relationship Between Marrow $T_2^*$ and Trabecular Bone Density Determined With a Chemical Shift-Selective Asymmetric Spin-Echo Sequence," *J. Magn. Reson. Imaging*, Vol. 2, page 209 (1992). These articles describe an echo offset technique whereby the phase-reversal RF pulse in the spin echo is offset in increments $\Delta\tau$ in which case the signal can be shown to evolve as $e^{-2\Delta\tau R2'}$.

Single scan techniques for measuring $R_2'$ are described by Pelc et al. in an article entitled "A Method For Mapping of $T_2'$ and For Improved $T_2$ Measurements," *Proc. Magn. Reson. Med.*, Seventh Annual Meeting San Francisco, Vol. 2, p. 746 (1988) and by the present inventors in an article entitled "Method For Image-Based Measurement of the Reversible and Irreversible Contribution to the Transverse Relaxation Rate," *J. Magn. Reson. Ser. B*, Vol. 111, pp. 61–69 (1996). These techniques exploit the fact that the signal after application of a 90°-τ-180°-τ pulse pair evolves with two different relaxation rate constants ($R_2^*=R_2+R_2'$ for the first τ-period, and $R_2-=R_2-R_2'$ for the second τ-period) before and after applying the 180° pulse. Unfortunately, such techniques have a very limited sensitivity when $R_2'$ is much smaller than $R_2$, in which case $R_2^*$ and $R_2$ become almost identical. A method which provides improved sensitivity for derivation of small $R_2'$ is desired.

As described by Ordidge et al. in an article entitled "Simultaneous $T_2$ and $T_2^*$-Weighted MRI Using a New Form of Stimulated Echo," *Proc. Soc. Magn. Reson.*, Third Annual Meeting Nice, Vol. 1, p. 670 (1995), the $T_2$ and $T_2^*$-dependence can also be demonstrated in a modified form of stimulated echoes collected in a single scan. However, the technique described by Ordidge et al. is incompatible with multi-slice acquisition and suffers from inferior signal to noise ratio due to the use of stimulated echoes. A technique for measuring $T_2$ and $T_2^*$ is desired which does not suffer from these limitations.

In particular, a technique is desired which can generate in a single pass and in multislice mode $T_2^*$ and $T_2$-weighted images from which $T_2'$ images can be exactly computed with high sensitivity for application in areas such as BOLD (blood's oxygenation level dependent) based functional imaging, assessment of bone quality (trabeculae bone density), characterization of brain iron concentrations, the study of tissue oxygenation in muscle, and perfusion by means of susceptibility agents. The techniques of the invention have been designed to meet these needs in the art.

SUMMARY OF THE INVENTION

The present invention addresses the above-mentioned needs in the art by measuring the reversible and irreversible dephasing rates, $R_2$ and $R_2'$, respectively, in a single scan while maintaining high sensitivity for small values of $R_2'$. The technique of the invention extracts both $R_2$ and $R_2'$ from an NMR measurement using the effective dephasing rate relationship $R_2^*=R_2+R_2'$. The present invention is based on the observation that in the case of a non-180° refocusing pulse applied at a time τ after the initial RF pulse, the transverse magnetization will be split into two different spin configurations. One of the two spin configurations evolves with a rate constant of $R_2-R_2'$ between times τ and 2τ and forms a spin echo at time 2τ before decaying with rate constant $R_2+R_2'$. The other spin configuration evolves with a rate constant $R_2+R_2'$, as if no refocussing pulse were applied. The two spin configurations have different responses to gradient pairs applied across the refocussing pulse and, therefore, the spin configurations can be measured separately with a judicious choice of gradient arrangement.

In accordance with a preferred embodiment of the invention, an α pulse and magnetic field gradient are initially applied to the sample. Since the precession frequency ω depends on the local magnetic field, the field gradient dephases the spins. The field gradient is then reversed, the spins are rephased, and the gradient echo is produced. If the gradient is applied for time Δ, the gradient echo amplitude decays to $e^{-R2^*\Delta}$ of the initial signal. The β pulse and a field gradient are then applied at time τ. As before, the β pulse rephases one of the spin configurations and produces a spin echo at time 2τ of magnitude $e^{-2R2\tau}$. By desirably selecting the field gradient characteristics, the other spin configuration can be recalled separately to form a gradient echo, allowing for the determination of both $R_2$ and $R_2'$. In particular, the application of the field gradient in conjunction with the β pulse produces a gradient echo at time 2τ+Δ with magnitude $e^{-R_2*(2\tau+\Delta)}$. By forming appropriate ratios and products of the resulting echo signals, $R_2$ and $R_2'$ are independently measured.

BRIEF DESCRIPTION OF THE DRAWINGS

The objects and advantages of the invention will become more apparent and more readily appreciated from the following detailed description of presently preferred exemplary embodiments of the invention taken in conjunction with the accompanying drawings, of which:

3

FIGS. 5(a)–(c) together illustrate an in vivo application of the method of the invention for mapping brain iron, where FIGS. 5(a) and 5(b) are the images respectively corresponding to echoes #3 and #4, and FIG. 5(c) shows the $R_2'$ image computed according to Equation [7], where α=β=90°, TR=2s, 2τ=60 ms and Δ=8 ms.

DETAILED DESCRIPTION OF THE PREFERRED EMBODIMENTS

A technique for measuring $T_2'$ and/or $R_2'$ in a single scan in accordance with presently preferred exemplary embodiments of the invention will be described below with reference to FIGS. 1–5. It will be appreciated by those of ordinary skill in the art that the description given herein with respect to those figures is for explanatory purposes only and is not intended in any way to limit the scope of the invention. All questions regarding the scope of the invention may be resolved by referring to the appended claims.

Figure 1:
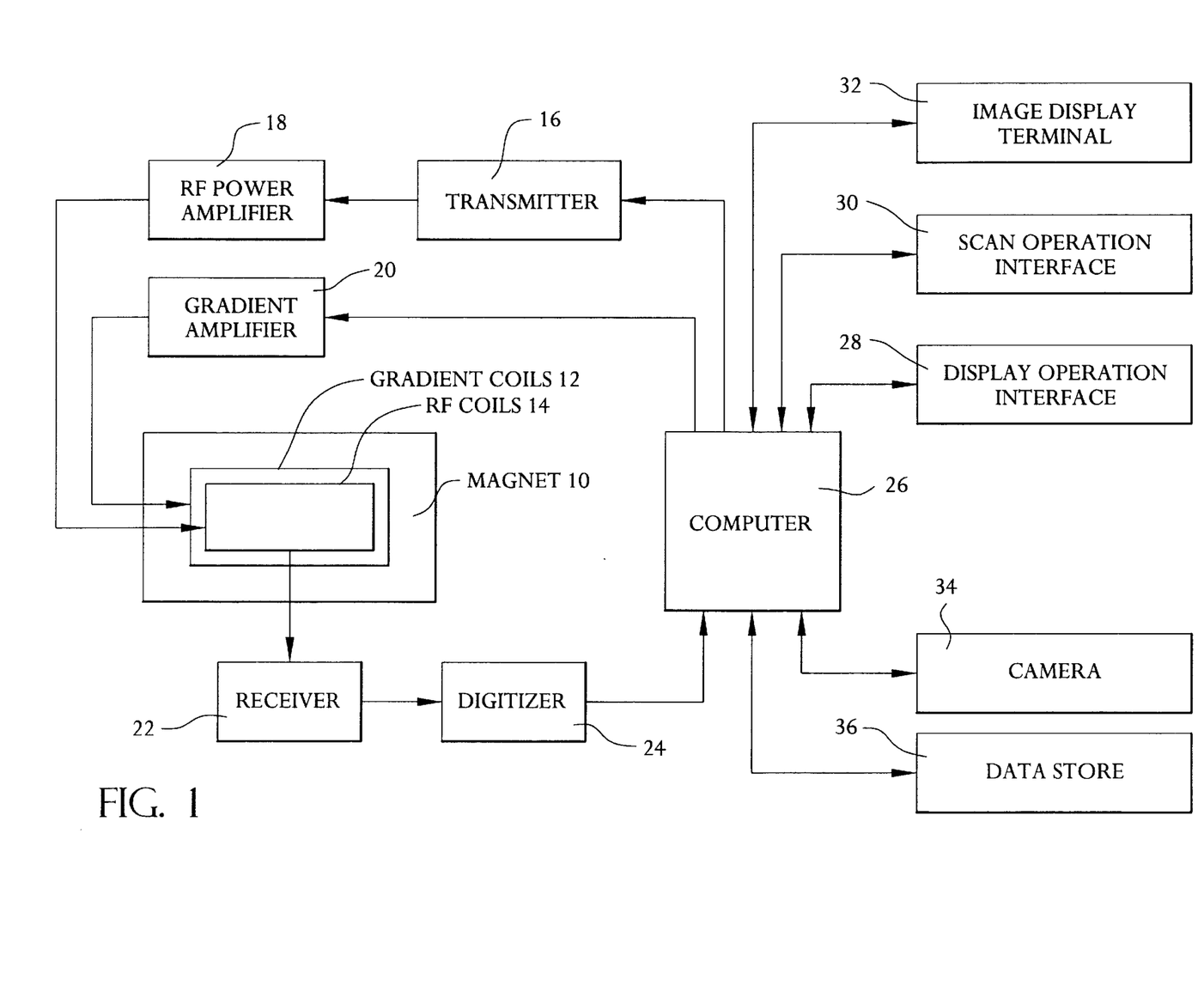
FIG. 1 is a block diagram of a conventional magnetic resonance imager that may be programmed to measure the reversible and irreversible transverse relaxation rates $R_2$ and $R_2'$, respectively, in accordance with the techniques of the invention.
Figure 2:
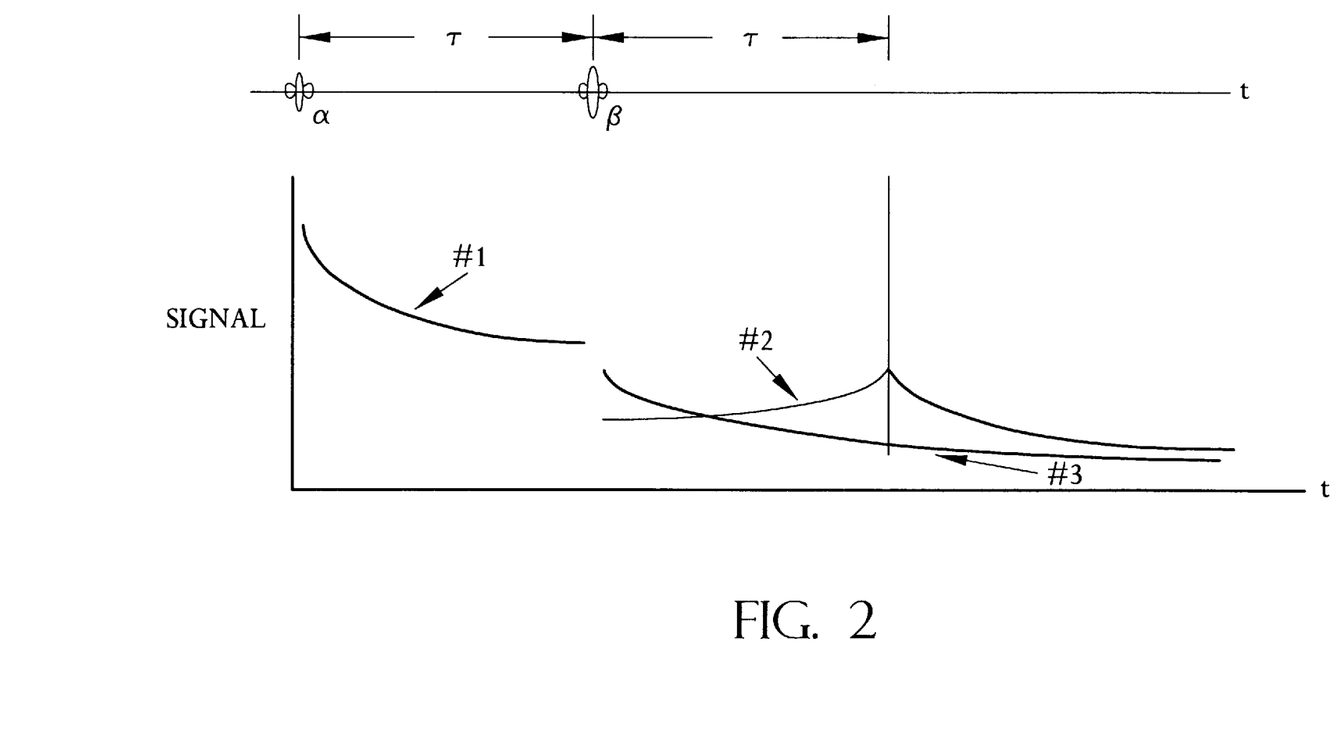
FIG. 2 illustrates the evolution as a function of time of the transverse magnetization signal produced by the α–β pulse pair.

FIG. 1 is a block diagram of a conventional magnetic resonance imager that may be programmed to measure the irreversible and reversible transverse relaxation rates $R_2$ and $R_2'$, respectively, in accordance with the techniques of the invention. As illustrated, the magnetic resonance imager comprises a magnet 10 for creating a magnetic field about the sample or patient, and gradient coils 12, RF coils 14, transmitter 16, RF power amplifier 18, and gradient amplifier 20 for generating pulse sequences for application to selected slices of the patient's anatomy or the sample. The resulting MR signal is received by signal receiver 22 and digitized at digitizer 24 for application to computer 26 for processing in accordance with the techniques of the invention. The processed signal is then displayed on a display device via display operation interface 28, scan operation interface 30, and/or image display terminal 32. A camera 34 and data memory 36 may also be provided as desired.

Those skilled in the art will appreciate that each of the components in FIG. 1 is standard equipment in commercially available MR imagers such as a Signa™ 1.5T whole body scanner equipped with SR-230 high-power gradients. However, as will be explained in more detail below, the computer 26 in such a device is programmed to generate specialized pulse sequences for splitting the gradient pulses to differentially affect $R_2$ and $R_2'$ to allow independent measurement of $R_2$ and $R_2'$. Since software techniques for generating pulse sequences with the characteristics defined below are believed to be well-known to those skilled in the art, such pulse generating techniques will not be described in further detail herein.

As known by those skilled in the art, the extent of local field inhomogeneity can be inferred from a measurement of the effective transverse relaxation time $T_2^*$, which is related to the spread in magnetic field ΔB as $1/T_2^* = 1/T_2 + \gamma\Delta B$, where γ represents the gyromagnetic ratio, $1/T_2$ represents the intrinsic transverse magnetization rate, and γΔB is the contribution to the effective transverse relaxation rate caused by the spread in magnetic field across the sample. Because the spin dephasing caused by ΔB is reversible by means of phase-reversal RF pulses (spin-echo), the effect is not perceptible in spin-echo imaging.

Now, if the effect of two RF pulses separated by a time interval τ is considered, the first RF pulse α (typically set to 90° and along the x-axis) may be assumed for convenience to generate a transverse magnetization Mτ(0)=1. A second RF pulse of flip angle β=180° produces, as is well known by those skilled in the art, a spin echo of magnitude $e^{-2R_2\tau}$ at time t=2τ. If, however, a flip angle β≠180° is chosen, the transverse magnetization created by an RF excitation pulse can be shown to be split by the β pulse at time τ into two different configurations whose time dependence for the conditions τ<t<2τ and t>2τ are given by Equations [1] and [2], respectively:

$$M_T(t) = \frac{1}{2}\{(1+\cos\beta)e^{-(R_2+R_2')t} + (1-\cos\beta)e^{-(R_2-R_2')t}e^{-2R_2'\tau}\} \quad [1]$$

$$M_T(t) = \frac{1}{2}\{(1+\cos\beta)e^{-(R_2+R_2')t} + (1-\cos\beta)e^{-(R_2+R_2')t}e^{2R_2'\tau}\} \quad [2]$$

As described in the afore-mentioned article by the present inventors, the first term in Equations [1] and [2] represents an always-decaying configuration with the same rate constant $R_2^*$ and relative weight (1+cos β)/2. The first term in Equations [1] and [2] is illustrated as #3 in FIG. 2, which illustrates the evolution as a function of time of the transverse magnetization signal produced by the α pulse (typically, though not necessarily 90° and along the x-axis) The $R_2'$ part in the exponential for the second term (which has relative weight (1−cos β)/2)) in Equations [1] and [2], on the other hand, changes sign at t=2τ, leading to an echo with an amplitude of (½)(1−cos β)$e^{-2R_2\tau}$. The second term in Equations [1] and [2] is illustrated as #2 in FIG. 2, which is discontinuous at t=2τ. The decay signal after application of α is illustrated as #1 in FIG. 2.

As explained by the present inventors in the afore-mentioned article, applying gradients on both sides of the β-pulse has a different effect on the two configurations of the transverse magnetization, $T_2$ and $T_2'$. While a pair of gradients of equal polarity and equal zeroth moment (defined as the time-dependent gradient G(t) whose integral over time vanishes) on either side of the β-pulse does not affect the phase of the second configuration, such a gradient pair dephases the first configuration. Similarly, application of a pair of gradients of equal zeroth moment but opposite polarity will dephase the second configuration without changing the phase of the first configuration. As a result, a judicious arrangement of gradients can be found to selectively recall the two configurations, which evolve with different time constants $T_2$ and $T_2^*$.

Figures 3A, 3B:
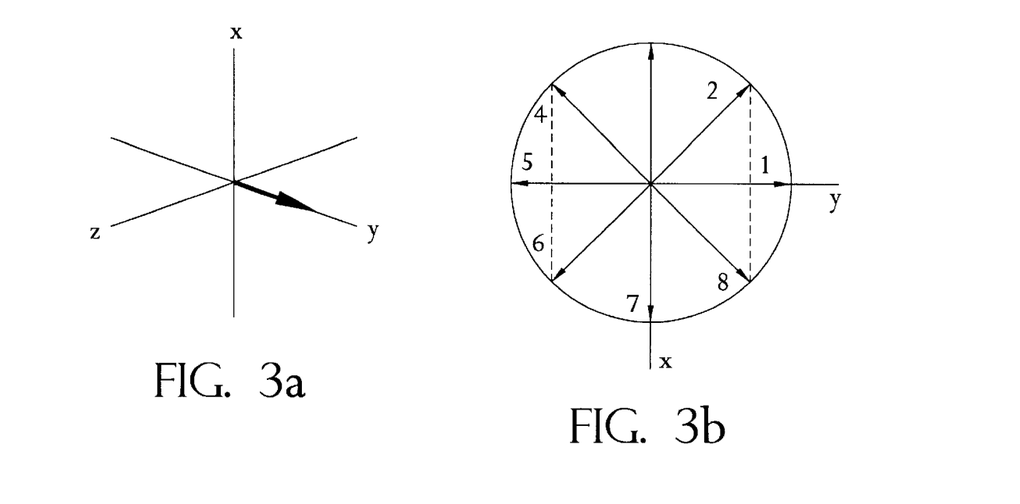
FIG. 3(a) illustrates the transverse magnetization created by an RF pulse of flip angle α applied around the x axis in the rotating frame.
FIG. 3(b) illustrates the transverse magnetization of FIG. 3(a) at some time τ, after the phases have spread out.
Figure 3C:
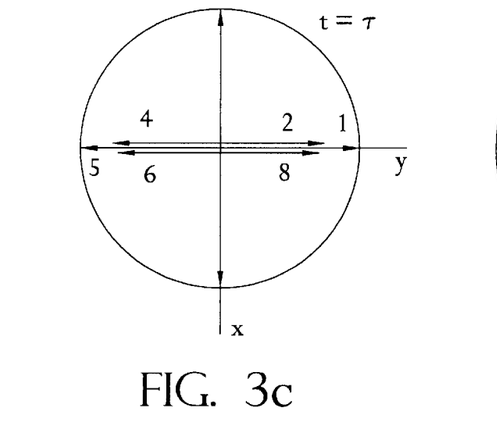
FIG. 3(c) illustrates for α=90° that certain components of the transverse magnetization will be affected by a 180° pulse applied at time τ around the y-axis and rotated out of the xy plane, resulting in xy projections.
Figure 3D:
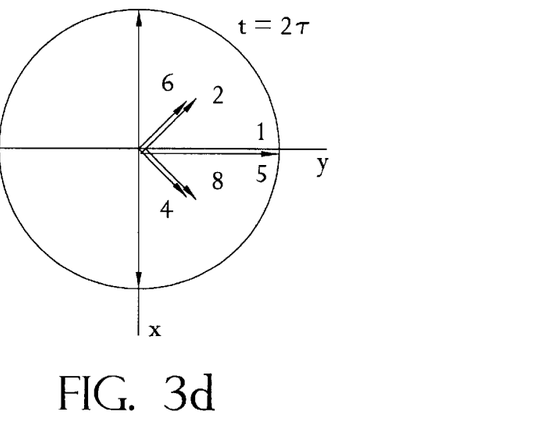
FIG. 3(d) illustrates the transverse magnetization of FIG. 3(c) at time t=2τ, after the various components have evolved further in phase, leading to an echo.

Now, suppose that transverse magnetization has been created by an RF pulse of flip angle α applied around the x axis in the rotating frame as shown in FIG. 3(a). After having been exposed to an inhomogeneous magnetic field, the spins making up the magnetization precess at different rates, some slower, some faster. At some time τ, their phases have spread out, as shown in FIG. 3(b). An RF pulse applied around the y axis will not affect components 1 and 5, which will evolve as though no RF pulse had been applied. By contrast, components 2, 4, 6 and 8 will be affected by the β pulse and rotated out of the xy plane, resulting in xy projections, as shown in FIG. 3(c) for a β=90° pulse. At time t=2τ the various components have evolved further in phase, leading to an echo as shown in FIG. 3(d). In accordance with the invention, the configuration affected by the phase-reversal RF pulse, as well as the configuration unaffected by the phase-reversal RF pulse are detected.

Figures 3E, 3F, 3G:
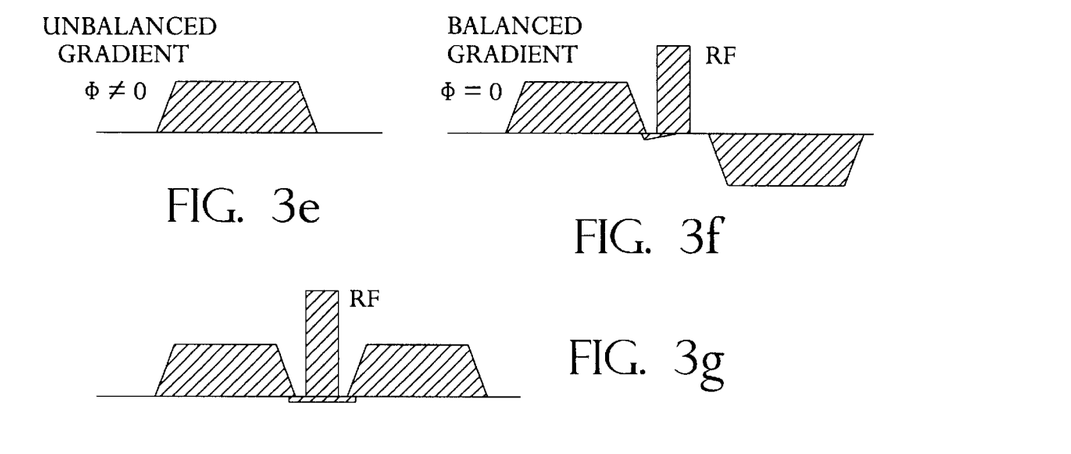
FIG. 3(e) illustrates an unbalanced time dependent magnetic field gradient.
FIG. 3(f) illustrates a balanced time dependent magnetic field gradient for the continually dephasing spin configuration, but which is unbalanced for the rephasing spin configuration.
FIG. 3(g) illustrates that two gradients of equal polarity, separated by an RF pulse, will result in zero phase and hence a balanced time dependent magnetic field gradient for the rephasing spin configuration, but which is unbalanced for the continually dephasing spin configuration.

Since the phase φ acquired by spins when exposed to magnetic field gradients is given by:

$$\phi = \gamma \int_{r1}^{r2} G(t)dt \quad [3]$$

where γ is the gyromagnetic ratio and G(t) is the unbalanced time dependent magnetic field gradient (FIG. 3(e)), Equation [3] implies that the phase is proportional to the area under the gradient-time curve. However, observation of an echo requires the gradients to be balanced, i.e., the sum of all phase integrals has to vanish as shown in FIG. 3(f). Further, as is well known, an RF pulse has the property of reversing the sign of the phase. Accordingly, two gradients of equal polarity, separated by an RF pulse, will also result in zero phase, as shown in FIG. 3(g). As will be explained below, these characteristics can be used to arrange gradients for selectively recalling the two different spin configurations with different relaxation constants.

FIG. 4 illustrates respective embodiments of RF and gradient pulse sequences to apply in order to selectively measure $R_2'$ in accordance with the techniques of the invention. FIG. 4(a) illustrates the α and β RF pulses separated by time τ, while FIG. 4(b) illustrates the gradient slice selection pulse and gradient pulses gzrf2 and gz1, where gzrf2 and gz1 are selected to have the same area to provide an overall balanced gradient for the continually dephasing spin configuration. FIG. 4(c) illustrates the optional phase encoding gradient, while FIG. 4(d) illustrates the resulting echo signals in a first embodiment.

Figures 4A, 4B:
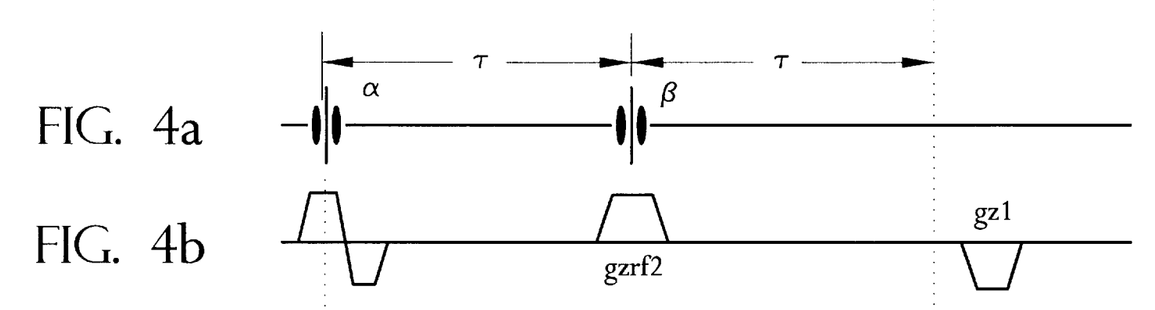
FIG. 4(a) illustrates the α and β RF pulses separated by time τ.
FIG. 4(b) illustrates the gradient slice selection pulse and gradient pulses gzrf2 and gz1, where gzrf2 and gz1 are selected to have the same area to provide an overall balanced gradient for the continually decaying configuration, recalled as Echo #4.
Figure 4C:
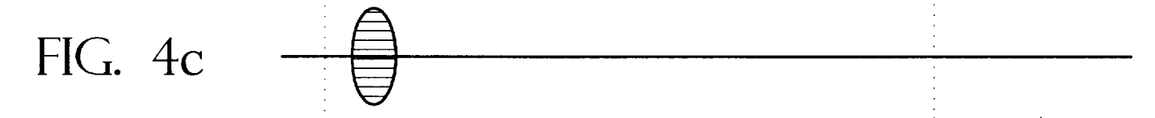
FIG. 4(c) illustrates the optional phase encoding gradient.
Figure 4D:
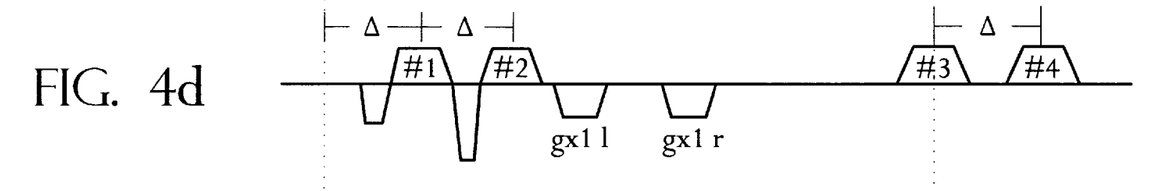
FIG. 4(d) illustrates the readout of two resulting echo signals caused by the pulse sequence of FIGS. 4(a)–4(c), illustrated as Echo #3 and Echo #4.

In FIG. 4(d), echoes #1 and #2 are conventional gradient echoes, which are formed at t=Δ and 2Δ and thus have amplitudes of $e^{-R_2^*\Delta}$ and $e^{-2R_2^*\Delta}$. Echo #3 at t=2τ, on the other hand, is an RF echo corresponding to the second term in Equations [1] and [2] and has an amplitude of (½)(1−cos β)$e^{-2R_2\tau}$. Echo #4 is formed from the continuously-decaying configuration (the first term in Equations [1] and [2]), which, at t=2τ+Δ, has an amplitude of (½)(1+cos β)$e^{-R_2^*(2\tau+\Delta)}$. Interference between the two different spin configurations is prevented because they are affected differently by the gradients gx1l and gx1r flanking the β-pulse and the first and second halves of gzrf2. In addition, the gradients on both x and z-axes have a zero zeroth moment at t=2τ+Δ for the signal that forms Echo #4:

$$\int_0^{2\tau+\Delta} G_{x,z}(t)dt = 0 \quad [4]$$

but the gradients are also balanced at time t=2τ for the signal that forms Echo #3. The transverse magnetization created by the β-pulse is eliminated by gradients gx1r and the second half of gzrf2. Additional gradient crushers could also be applied on the z-axis (not shown in FIG. 4) if necessary, or by phase alternation of the β-pulse using the techniques described by Ma et al. in an article entitled "Fast 3D Large-Angle Spin-Echo Imaging (3D FLASE)," *Magn. Reson. In Medicine*, Vol 35, pp. 903–910 (1996), since this signal is not phase encoded.

Figure 4E:
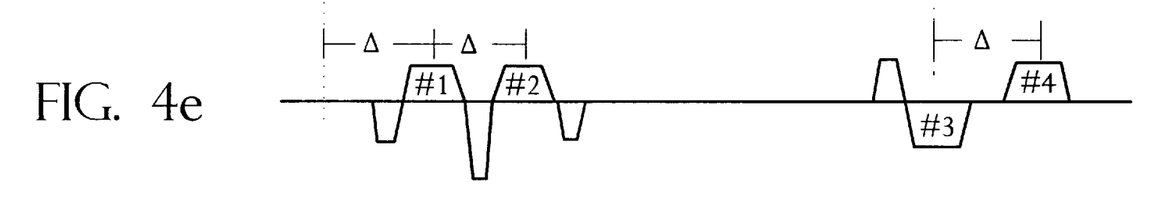
FIG. 4(e) illustrates an alternative pulse sequence in accordance with the invention in which the rephasing spin configuration is readout with a negative readout gradient as Echo #3.

Alternatively, in a different pulse embodiment illustrated in FIG. 4(e), gradients gx1l and gx1r may be eliminated in favor of applying a negative read-out gradient for creating Echo #3. In this case, gz1 would still be required to cancel the slice-selection gradient gzrf2 (and z-crushers if they are present) for Echo #4 and to prevent the signal that forms Echo #3 from corrupting Echo #4 since the gradients on the x-axis have zero moment for both configurations at both echo times.

Those skilled in the art will appreciate that Echo #2 is not strictly necessary since only three echoes are needed to form a $R_2'$ weighted image. However, as will be explained below, Echo #2 is desirable for calculating $R_2'$.

From Equations [1] and [2], the pixel-by-pixel ratio of the two magnitude images from Echo #3 ($S_3$) and Echo #4 ($S_4$) may be expressed as:

$$\frac{S_3}{S_4} = \frac{1-\cos\beta}{1+\cos\beta} e^{2R_2'\tau + R_2^*\Delta} \quad [5]$$

Multiplying Equation [5] by the magnitude image from Echo #1 ($S_1$) again on a pixel-by-pixel basis further removes the $R_2^*\Delta$ dependence in Equation [5]. This calibration correction may not be necessary since the condition $R_2^*\Delta << 2R_2'\tau$ can generally be satisfied by ensuring that $\Delta << 2\tau$, which can be achieved by appropriately selecting the readout timing. In any event, those skilled in the art will appreciate that Equation [5] (or after correction of the $R_2^*\Delta$ term by multiplying with $S_1$) provides a very sensitive $R_2'$ (or $T_2'$)-weighted image since 2τ can be made arbitrarily long with SNR permitting.

It should be noted that if the effective signal time evolution f*(t) can be characterized by the product of irreversible attenuation factor f(t) and its reversible counterpart f'(t), then:

$$\frac{S_4}{S_3} = \frac{1+\cos\beta}{1-\cos\beta} f'(2\tau) \quad [6]$$

as long as the extra decay during the Δ-interval between t=2τ and t=2τ+Δ can be neglected for Echo #4. This is important since the irreversible dephasing may not always be characterized by exponential processes.

Those skilled in the art will also appreciate that the relative intensity for the images from Echo #3 and Echo #4 can be arbitrarily adjusted by tuning the flip angle β, even though Echo #4 is recalled at a later time and is weighted by $R_2^*$ in comparison to $R_2$ for Echo #3.

The pulse sequence of FIG. 4(d) was implemented on a Signa™ 1.5T whole-body scanner equipped with SR-230 high-power gradients (150 ms rise time, 23 mT/m maximum amplitude), as described above with respect to FIG. 1. The pulse sequence was evaluated in a phantom and in the brain of a normal volunteer. An $R_2'$ map was generated from the four echoes $S_1$ through S as follows (for $\beta=90°$):

$$R_2' = -\frac{1}{2\tau} \ln\left(\frac{S_3 S_2}{S_4 S_1}\right) \quad [7]$$

The images obtained from a phantom with long $T_2$ ($\alpha=\beta=90°$, $2\tau=150$ ms, and $\Delta=10$ ms) revealed the different nature of echoes #3 and #4. Echoes #1 and #2 gave rise to essentially undistorted gradient echo images due to their relatively short echo times. While the image from Echo #3 was distortion-free and of the spin-echo type, the image from Echo #4 provided evidence of substantial $T_2^*$ for TE=160 ms. The different nature of the last two echoes was further verified by setting the flip angle $\beta$ to 0, in which case only Echo #4 appeared. By contrast, when the flip angle $\beta$ was set to 180°, only Echo #3 was present.

Figure 5A:
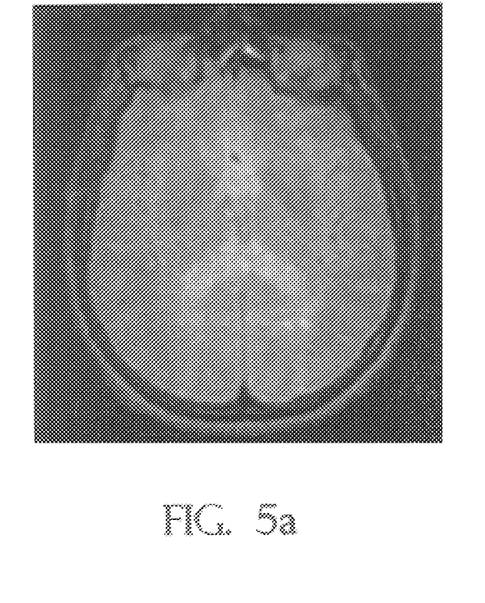
Figure 5B:
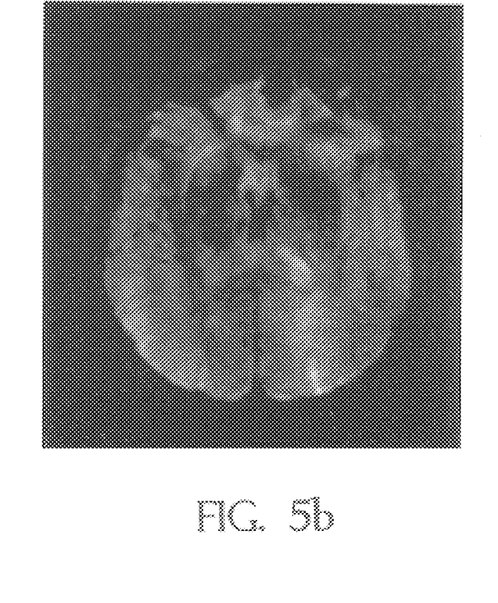
Figure 5C:
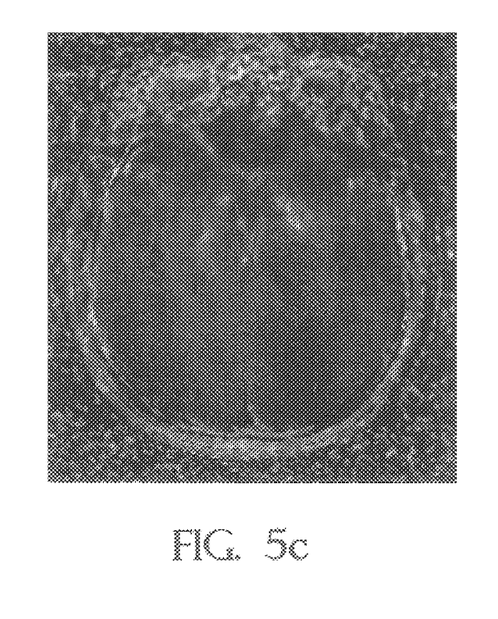

FIG. 5 illustrates an in vivo application of the method of mapping brain iron in accordance with the invention. FIGS. 5(a) and 5(b) are the images corresponding to Echo #3 and Echo #4 in FIG. 4(d), respectively. The image in FIG. 5(a) is $T_2$- weighted and the image in FIG. 5(b) is $T_2^*$-weighted with a similar echo time. FIG. 5(c) shows the $R_2'$ image, computed according to Equation [7]. Brain iron accumulation, in particular on the left side of the posterior/major aspect of the globus pallidus, is manifested as an enhancement in the image (arrow in FIG. 5(c)). Of course, the iron concentrations in other organs such as the liver may be similarly measured using the techniques of the invention.

The pulse sequence of the invention thus illustrates that due to the presence of both magnetization spin configurations following two RF pulses, it is possible to acquire RF and gradient echo images corresponding to similar echo times in a single scan. The SNR is also halved relative to that obtainable from separate spin gradient echoes.

Although exemplary embodiments of the invention have been described in detail above, those skilled in the art will appreciate that many additional modifications are possible in the exemplary embodiments without materially departing from the novel teachings and advantages of the invention. Those skilled in the art will appreciate that any pair of gradients on any axis or axes across the second RF pulse (e.g., $\beta$-pulse) can be used for the selection of the two spin configurations. A bipolar gradient pair could select the gradient echo configuration while a unipolar pair could select the spin echo configuration. For example, in contrast to recalling the rephasing spin configuration before the continually decaying spin configuration, as was done in both embodiments described above with respect to FIG. 4, it would be straightforward to one skilled in the art to design other gradient arrangements so that the continually decaying spin configuration is recalled before the rephasing configuration. Moreover, the technique of the invention need not be limited to MR imaging but may be applied to spectroscopy and interferometry as well for human subjects as well as inorganic objects and other subjects. In addition, those skilled in the art will appreciate that echo signals $S_1$ and $S_2$ are not necessary to estimate $R_2'$ so long as $\tau$ is sufficiently long and $S_3$ and $S_4$ occur at approximately the same time. Accordingly, all such modifications are intended to be included within the scope of this invention as defined in the following claims.

What we claim is:

1. A method of measuring two different spin configurations of transverse magnetization, from which a reversible dephasing rate constant $R_2'$ can be calculated, during a single scan of an object with a magnetic resonance imaging device, comprising the steps of:

applying a first RF pulse of flip angle $\alpha$ at a first time so as to generate a transverse magnetization in said object;

applying a first magnetic field gradient along a predetermined direction in said object;

applying a second RF pulse of flip angle $\beta$ at a second time $\tau$ seconds after said first time so as to split said transverse magnetization into first and second magnetic spin configurations which decay with different rate constants and can be separated from each other;

applying a second magnetic field gradient along the same predetermined direction as said first magnetic field gradient;

detecting a spin echo at a third time $2\tau$ seconds after said first time arising from said first magnetic spin configuration refocused by said second RF pulse; and detecting a gradient echo arising from said second magnetic spin configuration.

2. A method as in claim 1, comprising the additional step of calculating $R_2'$ as a function of said first and second magnetic spin configurations.

3. A method as in claim 2, wherein said calculating step comprises the step of calculating $R_2'$ as:

$$R_2' = -\frac{1}{2\tau} \ln\left(\frac{S_3 S_2}{S_4 S_1}\right) \quad [7]$$

where $S_1$ and $S_2$ are gradient echoes of said first magnetic field gradient, $S_3$ is said spin echo arising from said first magnetic spin configuration, and $S_4$ is said gradient echo arising from said second magnetic spin configuration.

4. A method as in claim 3, wherein the gradient echo $S_1$ occurs at a fourth time $\Delta$ seconds after said first time, the gradient echo $S_2$ occurs at a fifth time $2\Delta$ seconds after said first time, the spin echo $S_3$ occurs at said third time $2\tau$ seconds after said first time, and the gradient echo $S_4$ occurs at a sixth time $2\tau+\Delta$ seconds after said first time.

5. A method as in claim 1, wherein said second magnetic field gradient comprises a pair of gradients of equal zeroth moments on either side of said second RF pulse with flip angle $\beta$.

6. A method as in claim 5, wherein said pair of gradients on either side of said second RF pulse have equal polarities.

7. A method as in claim 5, wherein said pair of gradients on either side of said second RF pulse have opposite polarities.

8. A method as in claim 5, wherein said spin echo and said gradient echo are affected differently by said pair of gradients.

9. A method as in claim 1, wherein said first magnetic spin configuration decays with $T_2$ and said second magnetic spin configuration decays with $T_2^*$.

10. A method as in claim 1, wherein said second magnetic field gradient comprises a negative readout gradient which creates said gradient echo.

11. A method as in claim 1, comprising the further step of applying a phase encoding gradient.

12. A method as in claim 1, wherein said object is the vasculature or muscle of a patient and $R_2'$ represents myoglobin oxygen changes in the vasculature or muscle of said patient.

13. A method as in claim 1, wherein said object is an organ of a patient and $R_2'$ and $R_2$ for the patient's organ represent a concentration of iron in the patient's organ.

14. A method as in claim 1, wherein said object is cancellous bone of a patient and R2' reflects trabecular bone density and structure, and therefore bone quality.

15. A method of generating $T_2^*$ and $T_2$ weighted images in a single scan of an object using a magnetic resonance imaging device, comprising the steps of:

applying a first RF pulse of flip angle $\alpha$ at a first time so as to generate a transverse magnetization in said object;

applying a first magnetic field gradient along a predetermined direction in said object;

applying a second RF pulse of flip angle $\beta$ at a second time $\tau$ seconds after said first time so as to split said transverse magnetization into first and second magnetic spin configurations which decay with different rate constants and can be separated from each other;

applying a second magnetic field gradient along the same predetermined direction as said first magnetic field gradient;

detecting a spin echo at a third time $2\tau$ seconds after said first time arising from said first magnetic spin configuration refocused by said second RF pulse;

detecting a gradient echo arising from said second magnetic spin configuration; and generating said $T_2^*$ and $T_2$ weighted images as a function of images formed of said spin echo and gradient echo.

16. A magnetic resonance imaging device comprising:

a magnet which generates a magnetic field about an object;

gradient coils which apply gradient pulses to said object;

radio-frequency coils which apply radio-frequency pulses to said object;

driving circuitry which drives said gradient and radio-frequency coils;

receiving circuitry which receives a signal from said object in said magnetic field upon application of said gradient and radio-frequency pulses;

a display device for displaying said received signal; and a processing device which controls said radio-frequency coils to generate and apply a first RF pulse of flip angle $\alpha$ at a first time so as to generate a transverse magnetization in said object and a second RF pulse of flip angle $\beta$ at a second time $\tau$ seconds after said first time so as to split said transverse magnetization into first and second magnetic spin configurations which decay with different rate constants and can be separated from each other, which controls said gradient coils to generate and apply first and second magnetic field gradients along a predetermined direction in said object, and which generates an image of (1) a spin echo detected by said receiving circuitry at a third time $2\tau$ seconds after said first time arising from said first magnetic spin configuration refocused by said second RF pulse and/or (2) an image of a gradient echo arising from said second magnetic spin configuration.

17. An imaging device as in claim 16, wherein said processing device further calculates $R_2'$ as a function of said first and second magnetic spin configurations.

18. An imaging device as in claim 17, wherein said processing device calculates $R_2'$ as:

$$R_2' = \frac{1}{2\tau} \ln\left(\frac{S_3 S_2}{S_4 S_1}\right) \quad [7]$$

where $S_1$ and $S_2$ are gradient echoes of said first magnetic field gradient, $S_3$ is said spin echo arising from said first magnetic spin configuration, and $S_4$ is said gradient echo arising from said second magnetic spin configuration detected by said receiving circuitry.

19. An imaging device as in claim 18, wherein the gradient echo $S_1$ is detected by said receiving circuitry at a fourth time $\Delta$ seconds after said first time, the gradient echo $S_2$ is detected by said receiving circuitry at a fifth time $2\Delta$ seconds after said first time, the spin echo $S_3$ is detected by said receiving circuitry at said third time $2\tau$ seconds after said first time, and the gradient echo $S_4$ is detected by said receiving circuitry at a sixth time $2\tau+\Delta$ seconds after said first time.

20. An imaging device as in claim 16, wherein said processing device controls said gradient coils to apply said second magnetic field gradient as a pair of gradients of equal zeroth moments on either side of said second RF pulse with flip angle $\beta$ generated by said radio-frequency coils.

21. An imaging device as in claim 20, wherein said pair of gradients on either side of said second RF pulse have equal polarities.

22. An imaging device as in claim 20, wherein said pair of gradients on either side of said second RF pulse have opposite polarities.

23. An imaging device as in claim 20, wherein said spin echo and said gradient echo are affected differently by said pair of gradients applied to said object by said gradient coils.

24. An imaging device as in claim 20, wherein said pair of gradients are generated by said gradient coils so as to cause said first magnetic spin configuration to decay with $T_2$ and said second magnetic spin configuration to decay with $T_2^*$.

25. An imaging device as in claim 16, wherein said processing device controls said gradient coils to generate a negative readout gradient as said second magnetic field gradient, and said receiving circuitry detects said gradient echo that is frequency encoded by said negative readout gradient.

26. An imaging device as in claim 16, wherein said processing device controls said gradient coils to apply a phase encoding gradient to said object during an imaging of said object.

27. A magnetic resonance imaging device comprising:

a magnet which generates a magnetic field about an object;

gradient coils which apply gradient pulses to said object;

radio-frequency coils which apply radio-frequency pulses to said object;

driving circuitry which drives said gradient and radio-frequency coils;

receiving circuitry which receives a signal from said object in said magnetic field upon application of said gradient and radio-frequency pulses;

a display device for displaying said received signal; and a processing device which controls said radio-frequency coils to generate and apply a first RF pulse of flip angle $\alpha$ at a first time so as to generate a transverse magnetization in said object and a second RF pulse of flip angle $\beta$ at a second time $\tau$ seconds after said first time so as to split said transverse magnetization into first and second magnetic spin configurations which decay with different rate constants and can be separated from each other, which controls said gradient coils to generate and apply first and second magnetic field gradients along a predetermined direction in said object, and which generates $T_2$ and $T_2^*$ weighted images of an image of a spin echo detected by said receiving circuitry at a third time $2\tau$ seconds after said first time arising from said first magnetic spin configuration refocused by said second RF pulse and an image of a gradient echo arising from said second magnetic spin configuration.

* * * * *

UNITED STATES PATENT AND TRADEMARK OFFICE
CERTIFICATE OF CORRECTION

PATENT NO. : 5,860,921
DATED : January 19, 1999
INVENTOR(S) : Jingfei Ma and Felix Wehrli It is certified that error appears in the above-identified patent and that said Letters Patent is hereby corrected as shown below:

Column 1, line 7, before the heading "Background of the Invention" insert the following paragraph:

--This invention was supported by funds from the U.S. Government (National Institutes of Health grant No. R01 AR40671) and the U.S. Government may have certain rights in the invention.--

Column 2, line 50, change "$e-^R2^*(2\tau+2\Delta)$" to --$e-^{R2*(2\tau+2\Delta)}$--.

Column 5, line 18, change "precess" to --process--.

Column 7, line 3, change "(150ms rise time, " to --(150 s rise time,--

Signed and Sealed this

Twenty-ninth Day of June, 1999

Attest:

Q. TODD DICKINSON

Attesting Officer

Acting Commissioner of Patents and Trademarks